(12) United States Patent
Peng

(10) Patent No.: US 6,306,708 B1
(45) Date of Patent: Oct. 23, 2001

(54) FABRICATION METHOD FOR AN ELECTRICALLY ERASABLE PROGRAMMABLE READ ONLY MEMORY

(75) Inventor: Nai-Chen Peng, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/496,892

(22) Filed: Feb. 2, 2000

(51) Int. Cl.[7] ............................................. H01L 21/8247
(52) U.S. Cl. ............................................. 438/266; 438/594
(58) Field of Search ............................. 438/257–267, 438/593–594

(56) References Cited

U.S. PATENT DOCUMENTS

| 5,350,937 | * | 9/1994 | Yamazaki et al. | 257/316 |
|---|---|---|---|---|
| 5,379,255 | * | 1/1995 | Shah | 365/185 |
| 5,460,988 | * | 10/1995 | Hong . | |
| 5,563,083 | * | 10/1996 | Pein . | |
| 5,569,615 | * | 10/1996 | Yamazaki et al. . | |
| 5,616,510 | * | 4/1997 | Wong | 438/259 |
| 5,869,369 | * | 2/1999 | Hong | 438/259 |
| 5,953,605 | * | 9/1999 | Kodama | 438/231 |
| 5,969,384 | * | 10/1999 | Hong | 257/322 |
| 5,990,509 | * | 11/1999 | Burns, Jr. et al. | 257/296 |
| 5,998,261 | * | 12/1999 | Hofmann et al. | 438/257 |
| 6,093,606 | * | 7/2000 | Lin et al. | 438/259 |

* cited by examiner

Primary Examiner—Richard Booth
(74) Attorney, Agent, or Firm—Jiawei Huang; J.C. Patents

(57) ABSTRACT

A method is used to fabricate an electrically erasable programmable read only memory. First, a substrate is provided. Then, a doped polysilicon pillar is formed on the substrate. Furthermore, a source is formed in the substrate beneath the doped polysilicon pillar. Finally, the other structures of the memory are completed in sequence.

6 Claims, 5 Drawing Sheets

FABRICATION METHOD FOR AN ELECTRICALLY ERASABLE PROGRAMMABLE READ ONLY MEMORY

BACKGROUND OF THE INVENTION

1. Field of Invention

The present invention relates to a fabrication method for a semiconductor device, and more particularly, the present invention related to a fabrication method for an electrically erasable programmable read only memory (EEPROM) or a flash electrically erasable programmable read only memory (FLASH EEPROM).

2. Description of Related Art

The operation of a split-gate FLASH EEPROM can be performed by channel hot electron injection (CHEI) from a source to a floating gate. In such a method, a high source-to-floating gate coupling ratio is required in order to couple a high voltage from the source side to the floating gate side.

FIGS. 1 is a schematic, cross-sectional top view of a split-gate flash memory device according to the prior art. The structure of the split-gate flash memory device includes a substrate 10, comprising a source region 18 and a drain region 20. A gate oxide layer 12, a floating gate 14, a dielectric layer 16, and a control gate 18 are formed in sequence on the substrate 10.

However, a high source-to-floating gate coupling ratio needs a wide source 18 junction to floating gate 14 overlapped region 22 to provide electrons with enough energy to inject into the floating gate 14. That is, a very deep source junction is required. Unfortunately, the very deep source junction causes a restriction when scaling a cell down.

Therefore, the present invention provides a stacked source structure, which is applicable on a split-gate flash memory device. A stacked source structure provides a wide vertical interface between a source junction and a floating gate, and keeps the overlap between the stacked source structure of horizontal direction and floating gate as minimum as possible. Hence, the invention can greatly improve the capability for scaling the split-gate flash memory device down.

The invention provides a split-gate flash memory that has a stacked source structure with a source coupling with a plurality of floating gates. The stacked source structure comprises a source in the substrate and a vertical polysilicon pillar formed on the source in order to increase the source-to-floating gate coupling ratio. The stacked source structure has a vertically extended polysilicon pillar on the substrate, the vertical interface area between the stacked source structure and a floating gate is increased, and the overlap between the stacked source structure of horizontal direction and the floating gate is kept as minimum as possible. Hence, the invention can greatly improve the capability for scaling the split-gate flash memory device down. Meanwhile, the polysilicon pillar is at least shared by two floating gate.

From the other point of view, the method for fabricating the split-gate flash memory having the stacked source structure comprises providing a substrate, forming a doped polysilicon pillar on the substrate, and forming a source in the substrate beneath the doped polysilicon pillar.

According to a preferred embodiment of the present invention, the method for fabricating the doped polysilicon pillar comprises the following steps. A substrate is provided. An oxide layer is formed on the substrate. A trench is formed in the oxide layer to expose the substrate area designated for a source. A polysilicon layer fills with the trench. Ions are implanted into the polysilicon layer and the substrate area designated for the source. Then, the portion of the polysilicon layer is removed to form a doped polysilicon pillar.

In addition, an annealing process is performed to drive the ions into the substrate to form a source. Then, the oxide layer is removed. A first dielectric layer is formed to cover the polysilicon pillar and the substrate. A first doped polysilicon layer is deposited on the substrate, then the first doped polysilicon layer is patterned to form a floating gate, and the exposed first dielectric layer is removed. A second conformal dielectric layer covering the float gate and the substrate is formed on the substrate. Thereafter, a second doped polysilicon layer is formed on the substrate and then patterned into a control gate. Finally, a drain is formed in the substrate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIG. 2A to 2F are a schematic, cross-sectional view showing a process for fabricating a flash memory according to a preferred embodiment of the invention.

Figure 2A:
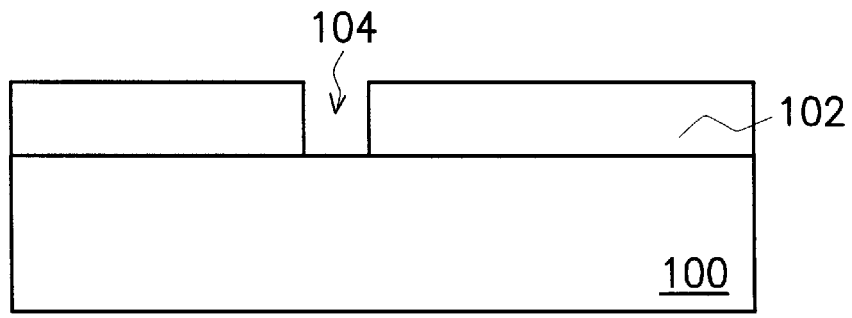
FIGS. 2A to 2F are a schematic, cross-sectional view showing a process for fabricating a flash memory according to a preferred embodiment of the invention.

Referring to FIG. 2A, a substrate 100 is, for example, silicon provided with a oxide layer 102, and is formed by, for example, chemical vapor deposition. The oxide layer 102 is patterned by, for example, reactive ion etching. The patterned oxide layer 102 has a trench 104 to expose the area of the substrate 100 designated for a source.

The oxide layer 102 having a thickness of about 1000–5000 Å is formed on a substrate 100 by, for example, chemical vapor deposition. The chemical vapor deposition can be low pressure chemical vapor deposition.

Figure 2B:
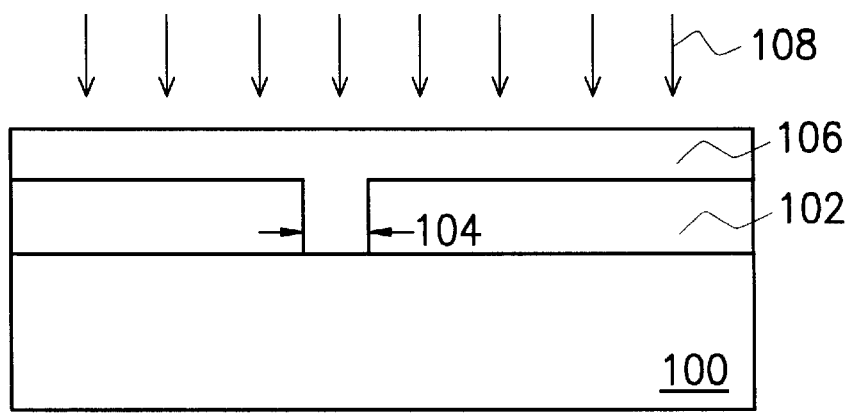

Referring to FIG. 2B, a polysilicon layer 106 is deposited on the substrate 100 and fills over the trench 104 by, for example, low pressure chemical vapor deposition. Ions 108 such as arsenic (As), phosphorus (P), a combination thereof or other N-type dopants having similar properties are implanted into the polysilicon layer 106 and the area of substrate 100 underneath the trench 104 designated for the source.

Figure 2C:
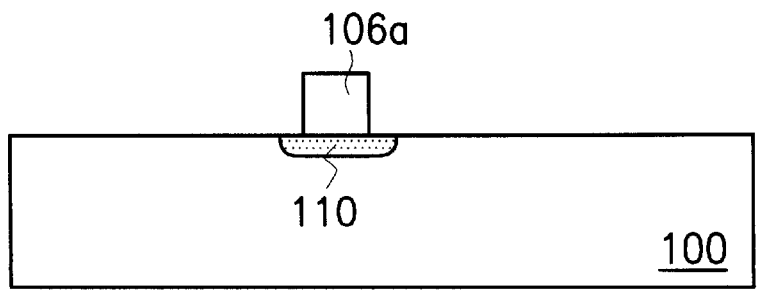

Referring to FIG. 2C, an annealing process is performed to drive the ions into the substrate 100 in order to form a source 110. The portion of the polysilicon layer over the oxide layer 102 is removed by a chemical mechanical polishing or an etching back process, and a polysilicon pillar 106a in the trench 104 is remained. Then, the oxide layer 102 is removed by wet etching using a solvent such as hydrofluoric acid.

Figure 2D:
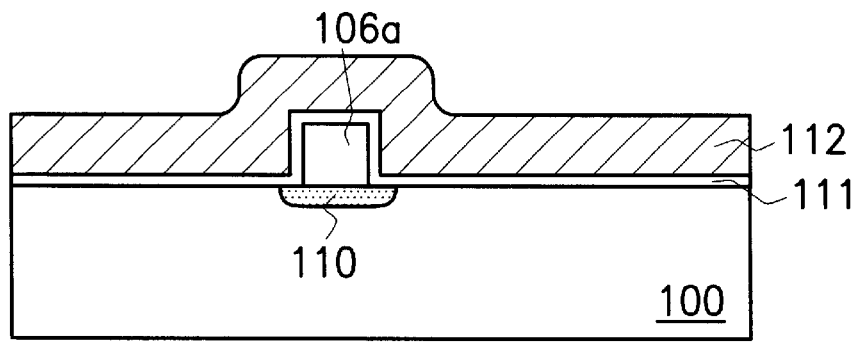

Referring to FIG. 2D, a first dielectric layer 111 is formed on the substrate 100 covering the polysilicon pillar 106a and the substrate 100 by, for example, thermal oxidation. A first doped polysilicon layer 112 is deposited on the substrate 100. The first doped polysilicon layer 112 can be in-situ doped, or it can be formed by ion implantation after the deposition. The dopant can be an N-type dopant such as phosphorus. In addition, the thermal oxidation and the annealing process can be simultaneously performed, since both processes are conducted at high temperature.

Figure 2E:
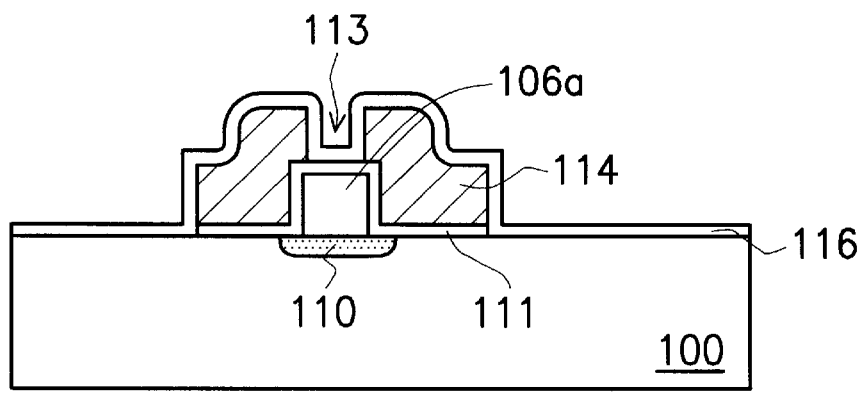

Referring to FIG. 2E, the first doped polysilicon layer 112 is patterned into two floating gates 114 to enhance the source-to-floating coupling ratio. The portion of the first dielectric layer 111 uncovered by the floating gate 114 and uncovering the polysilicon pillar 106a is removed. A conformal second dielectric 116 is, for example, an oxide/nitride/oxide (ONO) film or an inter-poly dielectric layer and is formed on the substrate 100 covering the float gates 114 and the substrate 100.

Figure 2F:
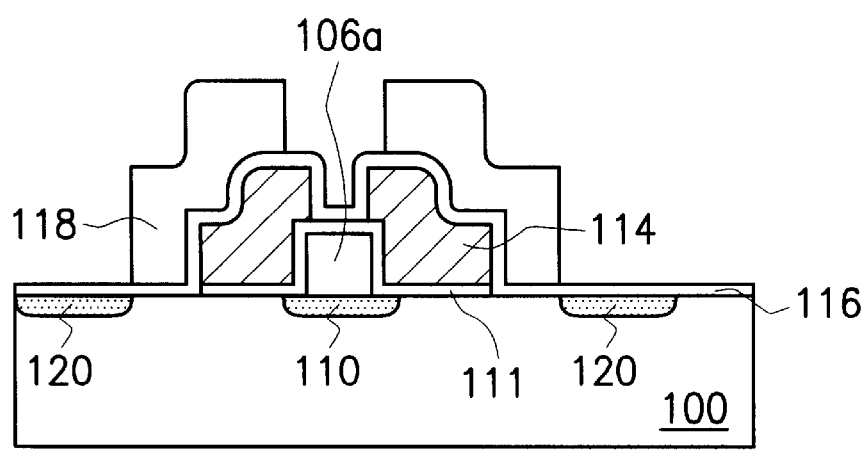

Referring to FIG. 2F, a second doped polysilicon layer 118 is deposited on the substrate 100 and then patterned into a control gate 118. The second doped polysilicon layer 118 can be in-situ doped. The substrate 100 is implanted with ions to form drains 120 using the control gate 118 as a mask (or says self-aligned drain). The second doped polysilicon layer 118 can be replaced with the tungsten silicide layer.

Figure 1:
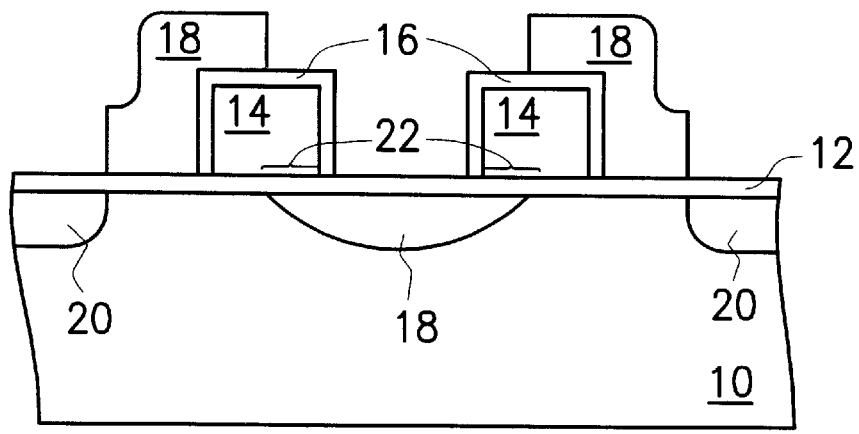
FIG. 1 is a schematic, cross-sectional view showing a split-gate flash memory according to the prior art.
Figure 3:
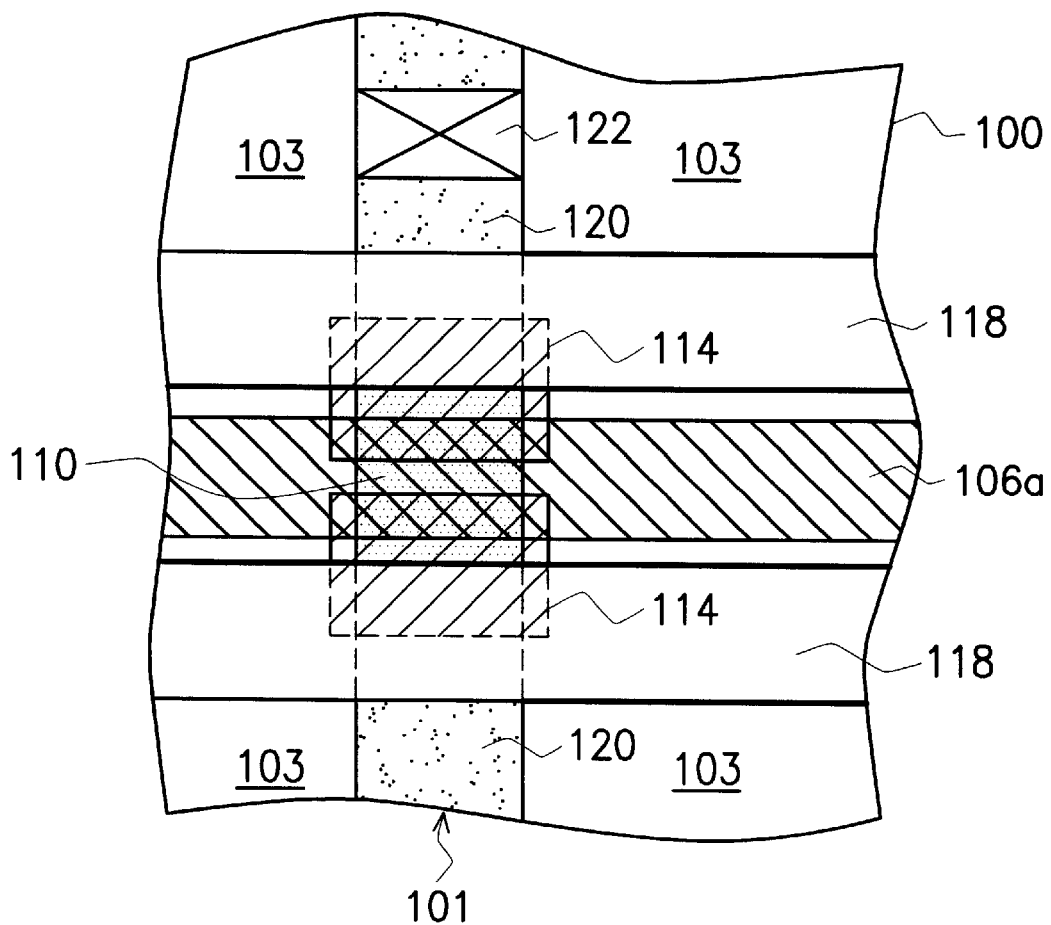
FIG. 3 is a schematic, top view showing a layout of a flash memory in FIG. 2F according to the preferred embodiment of the invention.

Referring to FIG. 3, FIG. 3 is a schematic, top view showing a layout of a flash memory in FIG. 2F. A substrate 100 is provided with a strip of a active area 101 and device isolation structures 103 formed thereon. The source 110 and drains 120 are formed in the active area. The polysilicon pillar 106a runs across the source 110 and is perpendicular to the active area 101. One floating gate 114 is formed on each of two sides of the source 110. Two strips of control gates 118 in parallel with the polysilicon pillar 106a are formed on the floating gate 114 and connected with the bitline (not shown). In addition, a drain contact window 122 is formed on the drain 110 to make a connection between the drain 120 and the bitline (not shown).

A preferred embodiment of the present invention is disclosed herein. In addition, the following is used to further disclose the spirit of the invention; thus, a modification of the preferred embodiment is provided as examples. In these examples, the invention can greatly improve the capability for scaling the split-gate EEPROM down.

In the labeling modified device cases, the devices are labeled as three digits. If two labeled numbers are only different in centesimal digit, both are designated as the same device. The difference in centesimal digit indicates whether the device is modified or not. In the present invention case, "1" is designated as a non-modified device, and "2" is designated as a modified device.

Figure 4:
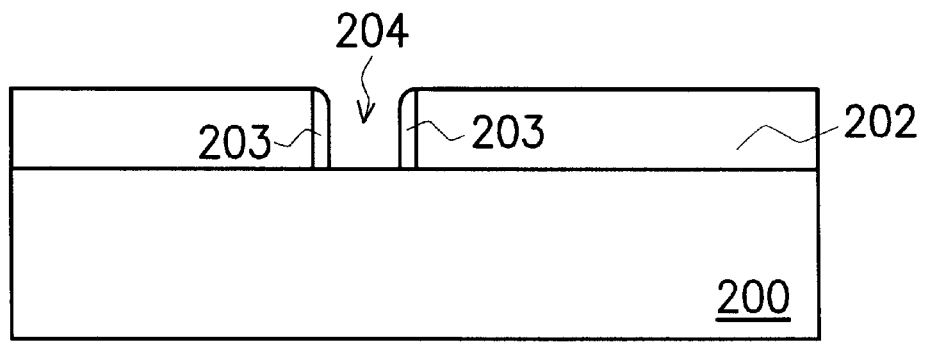
FIG. 4 is a schematic, cross-sectional view of the structure formed by a modified step in FIG. 2A according to the preferred embodiment of the invention.

Referring to FIG. 4, FIG. 4 is a schematic, cross-sectional view of the structure formed by a modified step in FIG. 2A according to the preferred embodiment of the invention. The spacer 203 are formed on the sidewall of the trench 204 (i.e. the trench 104 in FIG. 2A) to narrow the cross-sectional area of the trench 204; thus, the cross-sectional area of a subsequently formed polysilicon pillar is decreased to overcome the restriction caused by the resolution of photolithography.

The above-mentioned spacer 203 are formed by, for example, the following steps. A conformal film layer (not shown) fills the trench 204 to a thickness of about 500–2000 Å, and the film layer located over silicon oxide 202 is blanket etched back to form the spacer 203.

The film layer is, for example, silicon nitride, and the film layer is blanket etched back to form the spacer 203 using silicon oxide 202 as an etching stop. In other case, the film layer is, for example, silicon oxide, and the spacer 203 are formed by properly controlling the etching back time.

Figure 5A:
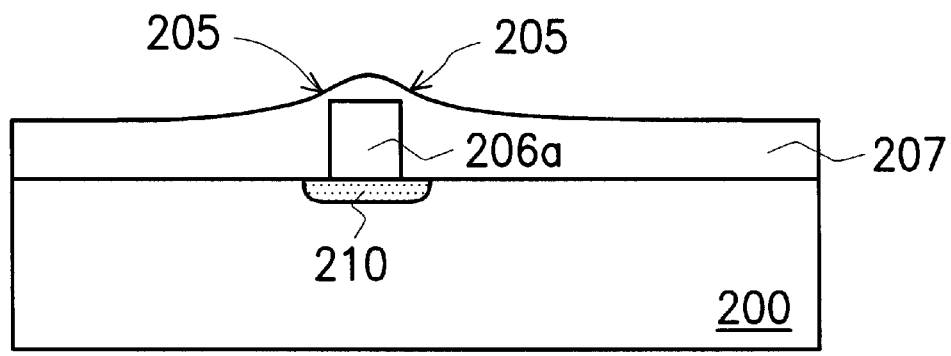
FIGS. 5A to 5B are a schematic, cross-sectional view of the structure formed by a modified step in FIG. 2C according to the preferred embodiment of the invention.
Figure 5B:
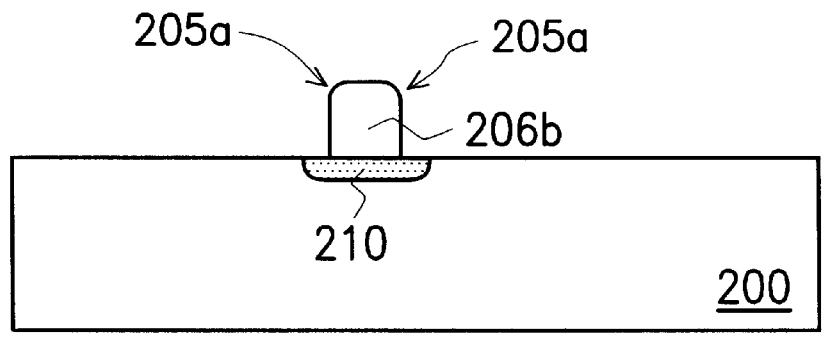

Referring to FIG. 5A and FIG. 5B, FIGS. 5A and 5B are a schematic, cross-sectional view of the structure formed by a modified step in FIG. 2C according to the preferred embodiment of the invention. In FIG. 5A, a polymer layer 207 is formed on the polysilicon pillar 206a and the substrate 100, and the polymer layer is baked for curing. The thickness of upper corners 205 of the polymer layer 207 located on the polysilicon pillar 206a is thinner than that of the top portion of the polymer layer 207. Continuing to FIG. 5A, the polymer layer 207 is then removed by etching until upper corners 205 of the polysilicon pillar 206a are exposed. Thereafter, the upper corners 205 of the polysilicon pillar 206a are removed by etching back for a short time, and then the polysilicon pillar 206b having modified corners 205a is formed to improve the floating gate to first dielectric layer breakdown and the retention of data in the memory.

The polymer layer 207 has a thickness of about 500–2000 Å before the etching step, and the baking temperature is about 100 to 150° C. The etching step includes the dry etching step, and the etching stop is detected by using a monochromometer for the silicon related bonding.

Figure 6A:
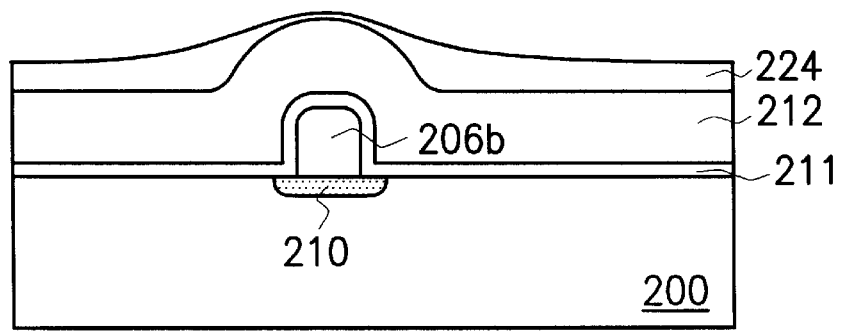
FIGS. 6A to 6C are schematic, cross-sectional views of the structure formed by a modified step in FIGS. 2D to 2E according to the preferred embodiment of the invention.
Figure 6B:
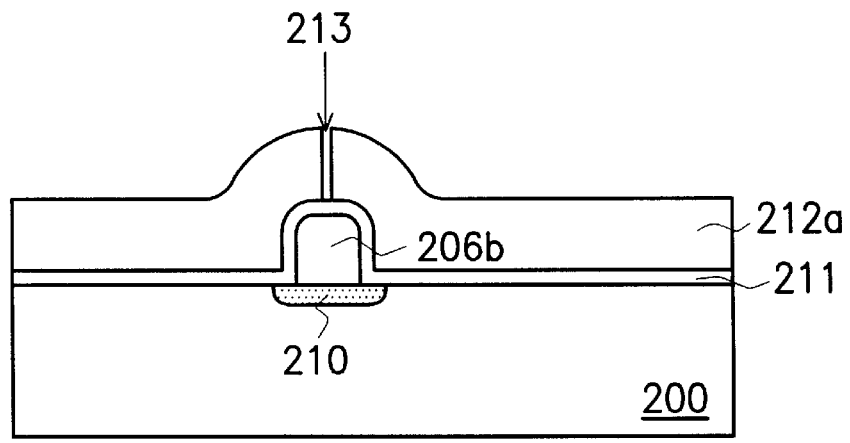
Figure 6C:
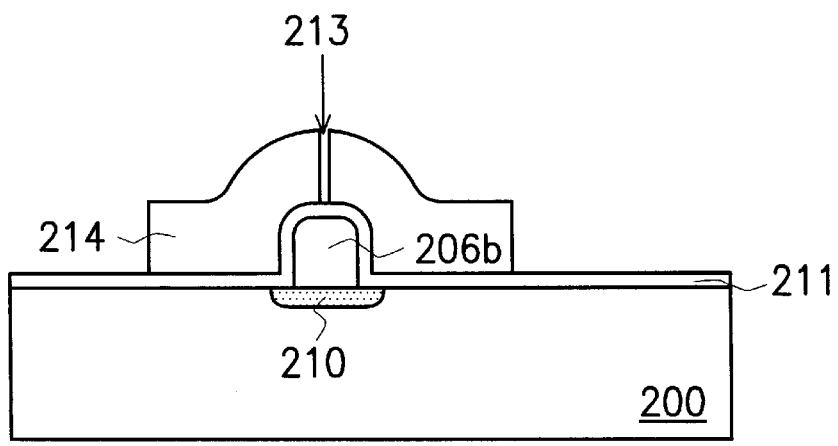

Referring to FIG. 6A to FIG. 6C, FIG. 6A to FIG. 6C are schematic, cross-sectional views of the structure formed by a modified step in FIG. 2D to FIG. 2E according to the preferred embodiment of the invention. The first dielectric layer 211, the first doped polysilicon 212 and the photoresist layer 224 are formed over the substrate 200 to cover the polysilicon pillar 206b. The photoresist is not solidified as coated. The curvature of the photoresist layer 224 is smaller than that of the first doped polysilicon layer 212. The thickness of the photoresist layer 224 is thinner over the arched portion of polysilicon pillar 212 on the top of the polysilicon pillar 206b than that of the other portion of the photoresist layer 224.

Using the above-mentioned feature, the photoresist layer 224 is etched by, for example, dry etching with an etching recipe of a low the first doped polysilicon layer 212 to the photoresist layer 224 selectivity to expose the first doped polysilicon layer 212. Hence, the photoresist layer 224 has a very small cut. The etching gas with the etching recipe of a low the first doped polysilicon layer 212 to the photoresist layer 224 selectivity is, for example, a combination of $O_2/CF_4$.

As the first doped polysilicon layer 212 is exposed, the etching recipe is switched to that of a very high the first doped polysilicon layer 212 to the photoresist layer 224 selectivity. The first doped polysilicon layer 212 is etched by using the photoresist layer 224 as a mask to expose the first dielectric layer 211, and an opening 213 is formed in the first doped polysilicon layer 212. The etching gas with the etching recipe of a very high the first doped polysilicon layer 212 to photoresist layer 224 selectivity is, for example, a combination of HBr/Cl$_2$. Then, the photoresist layer 224 is removed to obtain the resulting structure illustrated in FIG. 6B.

Referring to FIG. 6C, a photolithography process is performed to define the floating gate 214. In FIGS. 6A and 6B, the first doped polysilicon layer 212 is etched by using the photoresist layer 224 with a very small cut as an etching mask which is different from the etching mask used in FIG. 2E.

In FIGS. 6A and 6B, the step for cutting the first doped polysilicon layer 212 is performed by a non-photolithography process. The first doped polysilicon layer 212 is exposed by blanket etching the photoresist layer 224. The first doped polysilicon layer 212 is etched using the photoresist layer 224 with a very small cut as a mask to expose the first dielectric layer 211.

The blanket etching step is an etching step without using the etching mask. The region above the substrate 200 is etched away until the first doped polysilicon 212 is exposed. In addition, when the first doped polysilicon 212 is exposed, a very small cut is formed in the photoresist layer 224 in the middle of the top of polysilicon pillar is 206b to expose the arched first doped polysilicon layer 212. The exposed opening size is very small and much smaller than that obtained by the conventional photolithography process, that is, the opening is not restricted by the resolution of the conventional photolithography process.

According to the above-mentioned process, the spacer is formed on the sidewall of the trench to narrow the cross-sectional area of the trench; thus, the cross-sectional area of a subsequently formed polysilicon pillar is decreased to overcome the restriction caused by the resolution of photolithography. Therefore, the first doped polysilicon layer should be cut into two portions by a non-photolithography process.

If the first doped polysilicon layer is cut into two portions by a photolithography process, the cutting is not usually precise on the polysilicon pillar. The restriction is caused by the resolution of photolithography. This is the reason why we provide the cutting method using the arc feature to overcome the restriction caused by the resolution of photolithography.

The photoresist layer can be substituted for the other materials, for example, spin-on glass, organic anti-reflection (ARC) layer, etc. in the cutting process.

After the opening 213 is formed, the other portion of the first doped polysilicon layer 212 may be patterned to form the floating gates and other devices. If the photoresist layer 224 is formed on the first doped polysilicon layer in the cutting process, the other portion of the first doped polysilicon layer 212 can be patterned without removing the photoresist layer to form the floating gates and other devices by conventional photolithography.

The advantages of the invention are as follows:

1. The invention provides a stacked source structure, which is applicable to a split-gate EEPROM. A stacked source structure provides a wide vertical interface between a source junction and a floating gate to increase the source-to-floating gate coupling ratio, and keeps the overlap between the stacked source structure of horizontal direction and floating gate as minimum as possible. Therefore, the invention can greatly improve the capability for scaling the split-gate flash memory device down.

2. The invention provides a split-gate flash memory that has a stacked source structure with a source coupling with a plurality of floating gates. The stacked source structure comprises a source in the substrate and a vertical polysilicon pillar formed on the source in order to increase the source-to-floating gate coupling ratio. The stacked source structure has a vertically extended polysilicon pillar on the substrate, the vertical interface area between the stacked source structure and a floating gate is increased, and the overlap between the stacked source structure of horizontal direction and the floating gate is kept as minimum as possible.

3. The invention provides the modified upper corners of the polysilicon pillar to enhance the reliability of the memory.

4. The invention provides a method for cutting a polysilicon layer. The method is different from the conventional photolithography process and does not use any etching mask. The opening formed by the cutting between the floating gates is very narrow and is beyond that formed by the conventional photolithography process. Thus, the invention overcomes the resolution limitation of the photolithography and further reduces the size of the memory.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating an electrically erasable programmable read only memory, comprising:

providing a substrate having at least a strip of a active area formed thereon, and two isolation structures on the two sides of the active area formed therein;

forming an oxide layer on the substrate;

forming a trench in the oxide layer to expose the substrate area designated for a source, the trench being perpendicular to the active area;

filling the trench with a polysilicon layer to form a polysilicon pillar;

implanting ions into the polysilicon pillar and the substrate area designated for the source;

performing an annealing process to drive the ions into the substrate area designated for the source;

removing the oxide layer;

forming a first dielectric layer to cover the polysilicon pillar and the substrate;

depositing a first doped polysilicon layer on the substrate;

patterning the first doped polysilicon layer to form two floating gates in parallel with the polysilicon pillar, the two floating gates covering the sidewall and the top portion of the polysilicon pillar, respectively;

removing the exposed first dielectric layer;

forming a second dielectric layer on the substrate;

forming a conformal second dielectric layer covering the two floating gates and the substrate;

forming a second doped polysilicon layer on the substrate and patterning the second doped polysilicon layer into two control gates in parallel with the polysilicon pillar, the two control gates covering the sidewall and the top portion of the two floating gates; and implanting ions into the substrate area designated for two drains using the control gates as a mask.

2. The method for fabricating the electrically erasable programmable read only memory of claim 1, wherein an oxide spacer is formed on the sidewall of the trench after forming the trench and before forming the polysilicon pillar.

3. The method for fabricating the electrically erasable programmable read only memory of claim 2, wherein after forming the polysilicon pillar and before depositing the first doped polysilicon layer, the method further comprises:

forming a polymer layer on the substrate and then baking the polymer layer to solidify the polymer layer; and removing the polymer layer by a dry etching step until upper corners of the polysilicon pillar are exposed.

4. The method for fabricating the electrically erasable programmable read only memory of claim 3, wherein patterning the first doped polysilicon layer to form two floating gates process comprises:

forming a photoresist layer to cover the first doped polysilicon layer wherein the thickness of the photoresist layer on the top of the first doped polysilicon layer is thinner than that of the photoresist layer on other portions;

blanket etching the photoresist layer to cut the photoresist layer on the top of polysilicon pillar to expose the first doped polysilicon layer; and etching the first doped polysilicon layer using the photoresist layer with the cut as a mask to cut the first doped polysilicon layer.

5. A method for fabricating a stacked source structure, wherein the stacked source structure is for a flash memory, the steps of the method comprising providing a substrate;

forming a doped polysilicon pillar on the substrate;

forming a polymer layer on the doped polysilicon pillar and the substrate and then baking the polymer layer to solidify the polymer layer;

removing the polymer layer by a dry etching step until upper corners of the doped polysilicon pillar are exposed;

removing the upper corners of the doped polysilicon pillar to form a doped polysilicon pillar with modified corners; and forming a source in the substrate beneath the doped polysilicon pillar, wherein an annealing process is performed to drive dopants in the doped polysilicon pillar into the substrate to form the source.

6. A method for fabricating a stacked source structure, wherein the stacked source structure is for a flash memory, the steps of the method comprising providing a substrate;

forming a doped polysilicon pillar on the substrate;

forming a source in the substrate beneath the doped polysilicon pillar, wherein an annealing process is performed to drive dopants in the doped polysilicon pillar into the substrate to form the source;

forming a first dielectric layer to cover the doped polysilicon pillar and the substrate;

forming a first doped polysilicon layer on the first dielectric layer;

forming a photoresist layer on the first doped polysilicon layer, wherein the photoresist layer is not solidified as coated, and a thickness of a portion of the photoresist layer on top of the first doped polysilicon is thinner than thicknesses of other portions of the photoresist layer;

blanket etching the photoresist layer to cut the photoresist layer on top of the doped polysilicon pillar and to expose the first doped polysilicon layer; and etching the first doped polysilicon layer using the photoresist layer with a cut as a mask to cut the first doped polysilicon layer, thereby forming two floating gates covering the sidewall and the top portion of the doped polysilicon pillar.

* * * * *